United States Patent
Zhang

(10) Patent No.: US 10,446,612 B2
(45) Date of Patent: Oct. 15, 2019

(54) ORGANIC LIGHT-EMITTING DEVICE AND DISPLAY DEVICE

(71) Applicant: SHANGHAI TIANMA AM-OLED CO., LTD., Shanghai (CN)

(72) Inventor: Angran Zhang, Shanghai (CN)

(73) Assignee: SHANGHAI TIANMA AM-OLED CO., LTD., Shanghai (CN)

(*) Notice: Subject to any disclaimer, the term of this patent is extended or adjusted under 35 U.S.C. 154(b) by 27 days.

(21) Appl. No.: 15/802,453

(22) Filed: Nov. 3, 2017

(65) Prior Publication Data
US 2018/0061901 A1    Mar. 1, 2018

(30) Foreign Application Priority Data

Jun. 1, 2017  (CN) .......................... 2017 1 0405464

(51) Int. Cl.
*H01L 29/20*   (2006.01)
*H01L 27/32*   (2006.01)
(Continued)

(52) U.S. Cl.
CPC ........ *H01L 27/3206* (2013.01); *H01L 51/504* (2013.01); *H01L 51/5044* (2013.01);
(Continued)

(58) Field of Classification Search
CPC . H01L 27/32; H01L 27/3206; H01L 51/5206; H01L 51/5221; H01L 51/5016
See application file for complete search history.

(56) References Cited

U.S. PATENT DOCUMENTS

2010/0066239 A1* 3/2010 Spindler ............. H01L 51/5036
                                                      313/504
2014/0034930 A1* 2/2014 Seo ..................... H01L 51/5016
                                                      257/40
(Continued)

FOREIGN PATENT DOCUMENTS

| CN | 102779948 A | 11/2012 |
|----|-------------|---------|
| CN | 103794730 A | 5/2014 |
| CN | 105453294 A | 3/2016 |

OTHER PUBLICATIONS

CN First Office Action dated Mar. 7, 2018 in the corresponding Chinese application (application No. 201710405464.4).

*Primary Examiner* — Phuc T Dang
(74) *Attorney, Agent, or Firm* — Kilpatrick Townsend & Stockton LLP

(57) ABSTRACT

The present application discloses an organic light-emitting device and a display device. The organic light-emitting device comprises an anode, a cathode, and a first blue light emitting layer, a second blue light emitting layer and a yellow light emitting layer laminated between the anode and the cathode, wherein the yellow light emitting layer is arranged between the cathode and the first blue light emitting layer, and the first blue light emitting layer is arranged between the yellow light emitting layer and the second blue light emitting layer; and the yellow light emitting layer comprises a phosphorescent material, one of the first blue light emitting layer and the second blue light emitting layer comprises a blue fluorescent material, and the other one comprises a blue thermally-activated delayed fluorescent material used as an auxiliary material between a host and a guest.

20 Claims, 5 Drawing Sheets

(51) Int. Cl.
*H01L 51/52* (2006.01)
*H01L 51/50* (2006.01)
(52) U.S. Cl.
CPC ...... *H01L 51/5206* (2013.01); *H01L 51/5221* (2013.01); *H01L 51/5016* (2013.01)

(56) References Cited

U.S. PATENT DOCUMENTS

| | | | |
|---|---|---|---|
| 2016/0141538 A1* | 5/2016 | Lee | H01L 51/5044 257/40 |
| 2016/0197282 A1* | 7/2016 | Tanimoto | H01L 51/0057 257/40 |
| 2016/0343954 A1* | 11/2016 | Seo | H01L 51/0067 |
| 2017/0047536 A1* | 2/2017 | Wan | H01L 51/56 |
| 2017/0047553 A1* | 2/2017 | Yang | H01L 51/50 |
| 2017/0092875 A1* | 3/2017 | Parham | H01L 51/0052 |
| 2017/0222144 A1* | 8/2017 | Haketa | C07C 211/61 |
| 2017/0294587 A1* | 10/2017 | Kim | H01L 51/005 |

* cited by examiner

ORGANIC LIGHT-EMITTING DEVICE AND DISPLAY DEVICE

CROSS-REFERENCE TO RELATED APPLICATION

This application is related to and claims priority from Chinese Patent Application No. 201710405464.4, filed on Jun. 1, 2017, entitled "Organic Light-Emitting Device and Display Device," the entire disclosure of which is hereby incorporated by reference for all purposes.

TECHNICAL FIELD

The present application generally relates to the technical field of display, particularly to an organic light-emitting device and a display device.

BACKGROUND

With the development of information technology, the requirements of people on the performance of flat panel display are getting higher and higher. As a third generation display technology after cathode ray tube display and liquid crystal display, OLED (Organic Light-Emitting Diode) display has the advantages of low cost, wide viewing angle, low driving voltage, fast response speed, rich light-emitting color, simple preparation process, and capability of realizing large-area flexible display, and is considered one of the most promising display technologies.

As shown in FIG. 1, an OLED device may generally include an anode AN, an organic light-emitting layer EML and cathode CA. When a driving voltage is applied to the cathode CA and the anode AN, electrons and holes are injected into the organic light-emitting layer EML from the cathode CA and the anode AN respectively and are compounded to generate excitons which jump from an excitation state to a ground state to emit light. According to spin-statistics theory, the ratio of generated singlet excitons to triplet excitons is 1:3.

For a fluorescent material, the triplet excitons accounting for 75% cannot emit light due to nonradiative transition, and light emission is transition light emission dominated by the singlet excitons accounting for 25%, which means that 75% of energy is not used for light emission.

In order to overcome the shortcoming of low light-emitting efficiency of the fluorescent material, the energy of a triplet is fully utilized, and a phosphorescent material with singlet excitons and triplet excitons participating in light emission has been developed. By doping a phosphorescent material into a host material, the triplet energy of the host material is effectively transferred to a phosphorescence doped material, and the phosphorescence doped material generates phosphorescence to emit light, thereby enabling the internal quantum efficiency to reach 100% theoretically.

Although a red phosphorescent material and a green phosphorescent material with a high efficiency have been developed, there is no blue phosphorescent material that satisfies both light-emitting efficiency and reliability. Therefore, an existing OLED device usually utilizes a blue fluorescent material, which results in a lower light-emitting efficiency of a blue light-emitting device.

SUMMARY

In view of the above defects or shortcomings in the prior art, an organic light-emitting device and a display device are expected to be provided to solve the technical problems in the prior art.

According to one aspect of the present application, an organic light-emitting device is provided and includes an anode, a cathode, and a first blue light emitting layer, a second blue light emitting layer and a yellow light emitting layer laminated between the anode and the cathode, and the yellow light emitting layer is arranged between the cathode and the first blue light emitting layer, and the first blue light emitting layer is arranged between the yellow light emitting layer and the second blue light emitting layer; and the yellow light emitting layer includes a phosphorescent material, one of the first blue light emitting layer and the second blue light emitting layer includes a blue fluorescent material, and the other one includes a blue thermally-activated delayed fluorescent material used as an auxiliary material between a host and a guest.

In some embodiments, the organic light-emitting device further includes a plurality of charge generation layers arranged between the yellow light emitting layer and the first blue light emitting layer and between the first blue light emitting layer and the second blue light emitting layer.

In some embodiments, the blue thermally-activated delayed fluorescent material contains at least one of acridine, triazine, quinazoline, carbazole and derivatives, dibenzofuran, dibenzothiophene, benzene, biphenyl, naphthalene, and anthracene.

In some embodiments, the difference between a singlet energy level and a triplet energy level of the blue thermally-activated delayed fluorescent material is less than 0.15 eV.

In some embodiments, a photoluminescence spectrum of the blue thermally-activated delayed fluorescent material has a range of 450-470 nm.

In some embodiments, the blue thermally-activated delayed fluorescent material contains a group with a following structure:

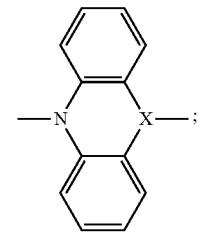

and, X is C, O, S, N or Si.

In some embodiments, the blue thermally-activated delayed fluorescent material includes:

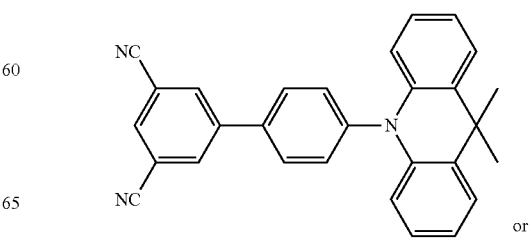

or

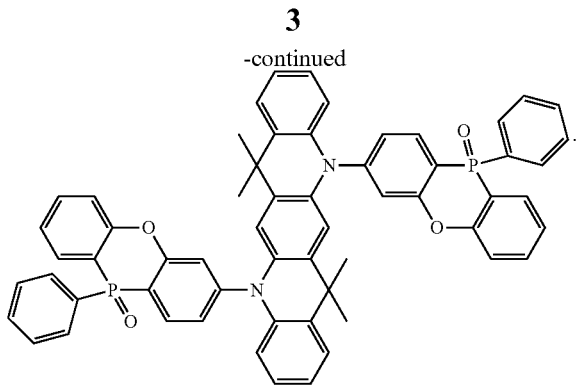

In some embodiments, the yellow light emitting layer includes a red phosphorescent material and a green phosphorescent material laminated together.

In some embodiments, the red phosphorescent material has a lowest unoccupied molecular orbital energy level of 2.9-3 eV and a highest occupied molecular orbital energy level of 5-5.8 eV.

In some embodiments, the green phosphorescent material has a lowest unoccupied molecular orbital energy level of 2.5-3 eV and a highest occupied molecular orbital energy level of 5-6 eV.

In some embodiments, the blue phosphorescent material has a lowest unoccupied molecular orbital energy level of 2.8-3 eV and a highest occupied molecular orbital energy level of 5.5-6 eV.

In some embodiments, the organic light-emitting device further includes a plurality of electron transport layers and a plurality of hole transport layers; and the electron transport layers are arranged between the cathode and the yellow light emitting layer, between the yellow light emitting layer and the first blue light emitting layer and between the first blue light emitting layer and the second blue light emitting layer, and the hole transport layers are arranged between the second blue light emitting layer and the anode, between the second blue light emitting layer and the first blue light emitting layer and between the first blue light emitting layer and the yellow light emitting layer.

In some embodiments, the mass percent of the blue thermally-activated delayed fluorescent material in the first blue light emitting layer or the second blue light emitting layer is 15-35%.

In some embodiments, the charge generation layer is doped with a p-type material on one side adjacent to the cathode and/or doped with an n-type material on one side adjacent to the anode, and the thickness of the charge generation layer is 10-50 nm.

In some embodiments, the p-type material includes at least one of:

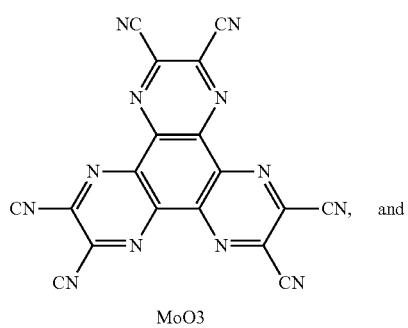

MoO3

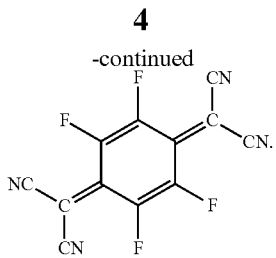

In some embodiments, the n-type material includes at least one of Yb, Mg, Al, Ca and compounds thereof.

In some embodiments, the hole transport layer includes a triphenylamine derivative, and the electron transport layer includes at least one of a spirofluorene derivative, a carbazole derivative and a combination thereof with at least one of triazinyl and oxadiazol.

In some embodiments, the organic light-emitting device is of a top emission type or a bottom emission type.

In some embodiments, the anode includes a transparent conducting material with a thickness of 10-100 nm; and the cathode includes a metal conducting material with a thickness of 10-50 nm.

In some embodiments, the anode further includes a light-tight metal conducting material.

According to another aspect of the present application, a display device is further provided, and includes the above organic light-emitting device.

According to the organic light-emitting device and the display device, provided by the present application, the light-emitting efficiency of the device is improved while the reliability is ensured by setting the organic light-emitting device to have a three-layer structure with the yellow light emitting layer and the two blue light emitting layers laminated together, and enabling one of the blue light emitting layers to include a blue thermally-activated delayed fluorescent material.

BRIEF DESCRIPTION OF THE DRAWINGS

Other features, objectives and advantages of the present application will become more apparent by reading a detailed description of the nonrestrictive embodiments made with reference to the following drawings.

DETAILED DESCRIPTION OF EMBODIMENTS

The present application will be further described below in detail in combination with the accompanying drawings and the embodiments. It should be appreciated that the specific embodiments described herein are merely used for explaining the relevant disclosure, rather than limiting the disclosure. In addition, it should be noted that, for the ease of description, only the parts related to the relevant disclosure are shown in the accompanying drawings.

It should also be noted that the embodiments in the present application and the features in the embodiments may be combined with each other on a non-conflict basis. The present application will be described below in detail with reference to the accompanying drawings and in combination with the embodiments.

Figure 1:
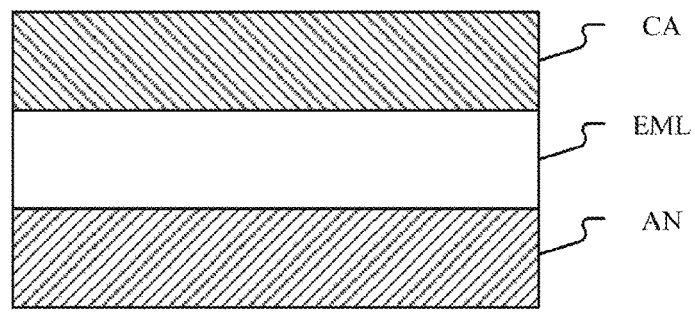
FIG. 1 shows a schematic diagram of an organic light-emitting device in the prior art.
Figure 2:
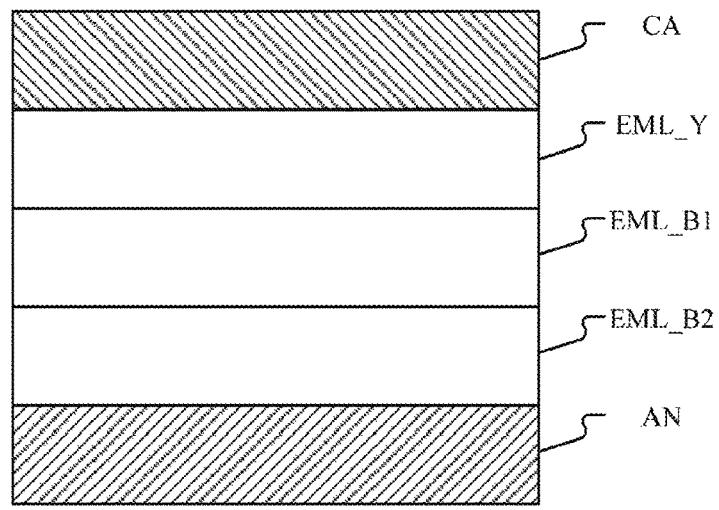
FIG. 2 shows a schematic diagram of the organic light-emitting device of one embodiment of the present application.

FIG. 2 shows a schematic diagram of the organic light-emitting device of one embodiment of the present application.

As shown in FIG. 2, the organic light-emitting device may include an anode AN, a cathode CA, and a first blue light emitting layer EML_B1, a second blue light emitting layer EML_B2 and a yellow light emitting layer EML_Y laminated between the anode AN and the cathode CA.

Further, the yellow light emitting layer EML_Y may be arranged between the cathode CA and the first blue light emitting layer EML_B1, and the first blue light emitting layer EML_B1 may be arranged between the yellow light emitting layer EML_Y and the second blue light emitting layer EML_B2.

The yellow light emitting layer EML_Y may include a phosphorescent material, one of the first blue light emitting layer EML_B1 and the second blue light emitting layer EML_B2 (for example, the first blue light emitting layer EML_B1) may include a blue fluorescent material, the other one (for example, the second blue light emitting layer EML_B2) may include a blue thermally-activated delayed fluorescent (TADF) material, and the blue thermally-activated delayed fluorescent material is used as an auxiliary material between a host and a guest.

Figure 3:
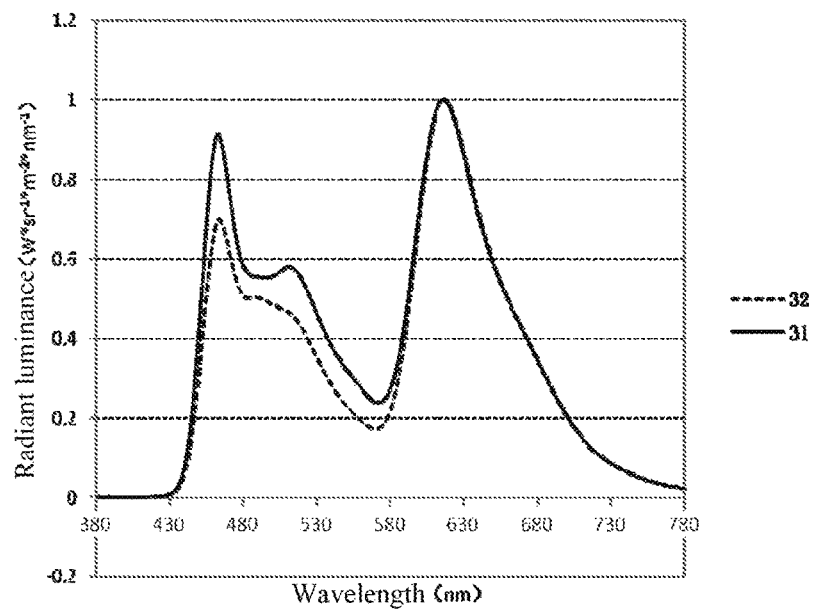
FIG. 3 shows a radiant luminance curve of the organic light-emitting device of the embodiment shown in FIG. 2.
Figure 4:
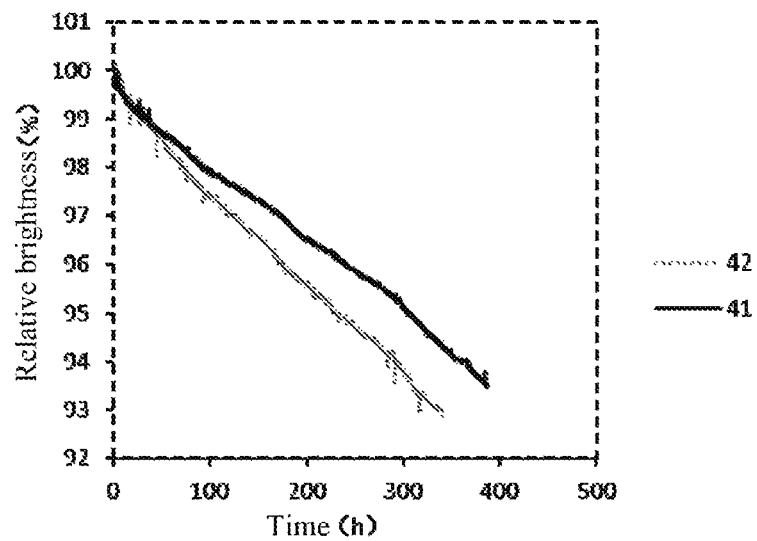
FIG. 4 shows a brightness attenuation curve of the organic light-emitting device of the embodiment shown in FIG. 2.

The some possible beneficial effects of the present embodiment may be illustrated by taking the first blue light emitting layer EML_B1 including the blue thermally-activated delayed fluorescent material and the second blue light emitting layer EML_B2 including a blue fluorescent material as an example in conjunction with FIG. 3 and FIG. 4.

In FIG. 3, a curve 31 is a radiant luminance curve of the organic light-emitting device of the present embodiment, and a curve 32 is a radiant luminance curve of the organic light-emitting device of a comparative embodiment. Here, the abscissa is spectral wavelength (unit: nm), and the ordinate is radiant luminance (unit: $W*sr^{-1}*m^{-2}*nm^{-1}$).

In FIG. 4, a curve 41 is a brightness attenuation curve of the organic light-emitting device of the present embodiment, and a curve 42 is a brightness attenuation curve of the organic light-emitting device of the comparative embodiment. Here, the abscissa is time (unit: h), and the ordinate is relative brightness (a percentage relative to initial brightness).

For a more objective illustration of the effect of the present embodiment, as shown in FIG. 3 and FIG. 4, by comparing the organic light-emitting device of the comparative embodiment with the organic light-emitting device of the present embodiment, the structures and materials are identical except for the first blue emitting layers EML_B1, and the first blue light emitting layers EML_B1 have an identical host material (for example, 4,4'-bis(N-carbazolyl) biphenyl, CBP for short), an identical guest material (for example, 4,4'-bis(9-ethyl-3-carbazovinylene)-1,1'-biphenyl, BCzVBi for short) and an identical film thickness, but the difference is that in the present embodiment, the first blue emitting layer EML_B1 is also doped with a blue thermally-activated delayed fluorescent material, for example, a compound ①:

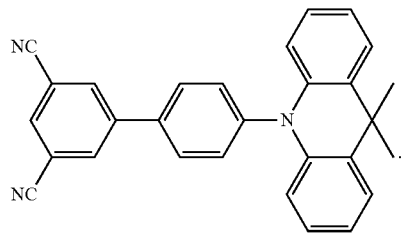

For example, the first blue light emitting layer of the comparative embodiment may be formed by doping 75% of CBP and 25% of BCzVBi, but the first blue light emitting layer EML_B1 of the present embodiment may be formed by doping 73% of CBP, 25% of the compound ① and 2% of BCzVBi.

The difference (ΔEst) between the singlet energy level and the triplet energy level of the thermally-activated delayed fluorescent material is small (usually less than 0.3 eV), the triplet exciton of the material may be transformed into a singlet exciton through reverse intersystem crossing (RISC) under environment thermal energy, and the material emits light through fluorescent radiation, therefore, the internal quantum efficiency of the thermally-activated delayed fluorescent material may also reach 100% theoretically.

It can be seen from FIG. 3, compared with the comparative embodiment, the organic light-emitting device of the present embodiment has a higher light-emitting efficiency when emitting blue light (with a wavelength usually between 400 nm and 490 nm) and green light (for example, the wavelength is usually between 490 nm and 580 nm. Therefore, the white light after three-primary-color overlay (the CIE coordinate of the white light of the present embodiment is (0.378, 0.333), but the CIE coordinate of the white light of the comparative embodiment is (0.404, 0.329)) is closer to ideal white light (the CIE coordinate is (0.333, 0.333)), in other words, the white light obtained by the organic light-emitting device of the present embodiment has higher color purity.

The organic light-emitting devices of the present embodiment and the comparative embodiment are subjected to an aging test respectively, the current density of the aging test is 50 mA/cm², an attenuation curve as shown in FIG. 4 is obtained, and Table 1 lists part of attenuation data.

TABLE 1 attenuation time of the organic light-emitting devices

| | attenuation time (h) | |
|---|---|---|
| Relative brightness (%) | Comparative embodiment | Present embodiment |
| 100 | 0 | 0 |
| 99 | 25.445 | 31.095 |
| 98 | 71.013 | 90.878 |
| 97 | 118.251 | 169.807 |
| 96 | 174.052 | 239.203 |
| 95 | 227.487 | 303.961 |

It can be seen from FIG. 4 and Table 1, compared with the comparative embodiment, the service life of the organic light-emitting device of the present embodiment is obviously prolonged, for example, taking that the relative brightness of the device attenuating to 95% of an initial value is used as the service life of the organic light-emitting device as an example, it can be calculated that the service life (about 304 h) of the organic light-emitting device of the present embodiment is about 33.6% (about 76.5 h) longer than the service life (about 227.5 h) of the organic light-emitting device of the comparative embodiment.

It can be seen from the above that in the present embodiment, the light-emitting efficiency and service life of the organic light-emitting device are improved by setting the organic light-emitting device to have a three-layer structure with the yellow light emitting layer and the two blue light emitting layers laminated together, and enabling one of the blue light emitting layers to include a blue thermally-activated delayed fluorescent material.

Although FIG. 2 shows that the cathode CA is above the anode AN, it is only schematic. It should be appreciated that the positions of the cathode CA and the anode AN can be interchanged, and can be set by those skilled in the art according to needs of actual application scenarios.

It should be noted that although the present embodiment describes that the first blue light emitting layer EML_B1 includes the blue thermally-activated delayed fluorescent material, it should be understood by those skilled in the art that the blue thermally-activated delayed fluorescent material may also be contained in the second blue light emitting layer EML_B2, and the blue fluorescent material may also be contained in the first blue emitting layer EML_B1.

In addition, the guest material of the first blue light emitting layer EML_B1 may be a fluorescent material, for example, BCzVBi in the present embodiment, which is not defined in the present application.

The blue thermally-activated delayed fluorescent material serving as the auxiliary material between the host and the guest of the first blue light emitting layer EML_B1 has a doping ratio usually higher than that of the guest material but lower than that of the host material. The doping ratio of the guest material is usually less than 10%, for example, 2%, 5%, etc.

Optionally, the mass percent of the blue thermally-activated delayed fluorescent material in the first blue light emitting layer EML_B1 or the second blue light emitting layer EML_B2 is 15-35%.

In this way, triplet excitons can be transformed into singlet excitons more efficiently, and when the doping ratio of the blue thermally-activated delayed fluorescent material changes from 15% to 35%, the efficiency of transforming the triplet excitons into the singlet excitons increases with the increase of the doping ratio, and starts to decrease with the increase of the doping ratio after increasing to a certain value. In other words, there is an optimal value (which can be obtained through experiments, for example, 25%) between 15% and 35% to ensure that the efficiency of transforming the triplet excitons into the singlet excitons is highest.

Optionally, the blue thermally-activated delayed fluorescent material may contain at least one of acridine, triazine, quinazoline, carbazole and derivatives, dibenzofuran, dibenzothiophene, benzene, biphenyl, naphthalene, and anthracene.

Because the thermally-activated delayed fluorescent materials with the above groups may have a smaller ΔEst easily, may achieve transformation from the triplet excitons to the singlet excitons easily, and may be used as a blue thermally-activated delayed fluorescent material, the selection of materials especially the blue light-emitting material of the organic light-emitting device is enriched.

In addition, because the singlet energy level and the triplet energy level in a thermally-activated delayed fluorescent material are adjacent energy levers, and the thermally-activated delayed fluorescent material transforms the triplet energy level into the singlet energy level through reverse intersystem crossing, in order to efficiently generate the reverse intersystem crossing, the difference ΔEst between the singlet energy level and the triplet energy level needs to be further reduced.

Optionally, the difference ΔEst between the singlet energy level and the triplet energy level of the blue thermally-activated delayed fluorescent material is less than 0.15 eV. In this way, the reverse intersystem crossing in the second blue light emitting layer EML_B2 may be generated more efficiently, thereby further improving the light-emitting efficiency of the organic light-emitting device.

Optionally, the photoluminescence spectrum wavelength λ of the blue thermally-activated delayed fluorescent material has a range of 450-470 nm.

A photoluminescence spectrum refers to intensity or energy distribution of light emitted at different wavelengths by a light-emitting material under the excitation of light with a specific wavelength. A luminescent spectrum of many light-emitting materials is a continuous spectral band and consists of one or more peak-like curves. The narrower the spectral wavelength range is, the higher the light-emitting efficiency is, and the higher the color purity of the emitted light is; and experimental results show that a blue light-emitting material has a highest light-emitting efficiency and a highest color purity when the peak value of the luminescent spectrum is 460 nm. Thus, when the photoluminescence spectrum wavelength λ is between 450 nm and 470 nm, the blue thermally-activated delayed fluorescent material may have a higher light-emitting efficiency and color purity.

Optionally, the blue thermally-activated delayed fluorescent material contains a group with a following structure:

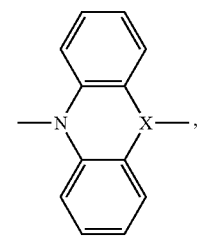

and, X is C, O, S, N or Si.

Further, the blue thermally-activated delayed fluorescent material includes:

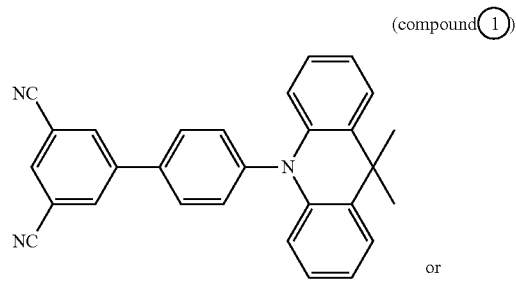

(compound 1)

or

-continued

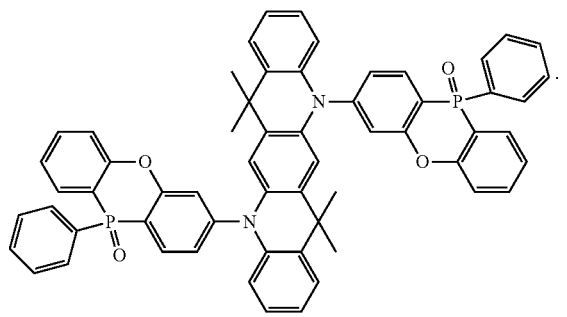
(compound ②)

Table 2 shows characteristic parameters of the compound ① and the compound ②.

TABLE 2

Characteristic parameters of the compound① and compound②

|  | ΔEst (eV) | Photoluminescence spectrum wavelength λ (nm) |
|---|---|---|
| compound① | 0.0837 | 470 |
| compound② | 0 | 457.94 |

It can be seen from Table 2 that the differences between singlet energy levels and triplet energy levels of the compound ① and the compound ② are less than 0.15 eV, and the photoluminescence spectrum wavelengths are between 450 nm and 470 nm. When the compounds are used as an auxiliary material of the second blue light emitting layer EML_B2, the organic light-emitting device may have a higher light-emitting efficiency and a longer service life.

Optionally, the blue phosphorescent material has a lowest unoccupied molecular orbital (LUMO) energy level of 2.8-3 eV and a highest occupied molecular orbital (HOMO) energy level of 5.5-6 eV. The blue fluorescent material meeting the LUMO and the HOMO of the above ranges may enable, for example, the second blue light emitting layer to have a higher light-emitting efficiency.

Figure 5:
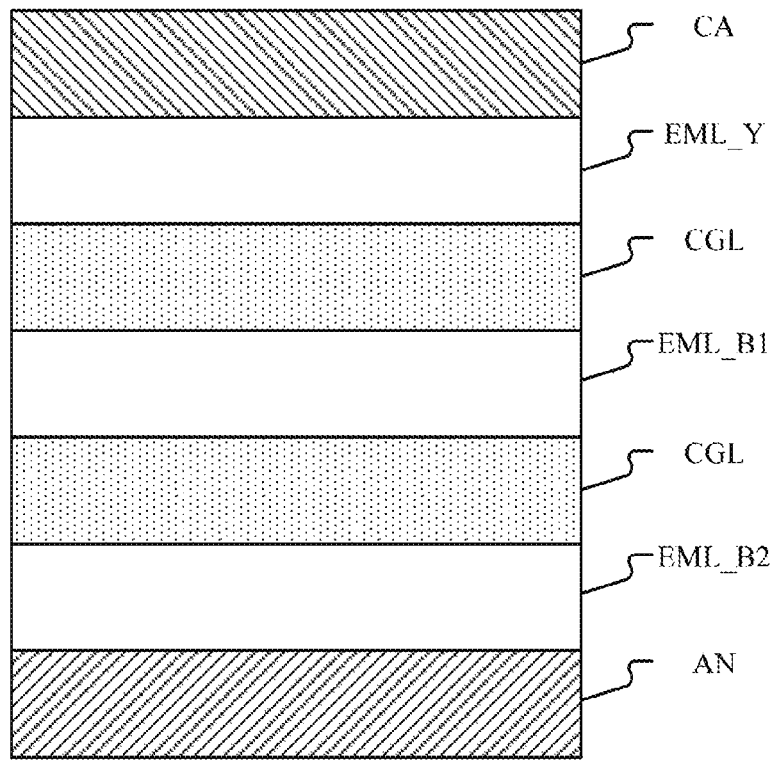
FIG. 5 shows a schematic diagram of the organic light-emitting device of another embodiment of the present application.

Continue to refer to FIG. 5, it shows a schematic diagram of the organic light-emitting device of another embodiment of the present application.

Similar to the embodiment shown in FIG. 2, the organic light-emitting device in the present embodiment may also include an cathode CA, a yellow light emitting layer EML_Y, a first blue light emitting layer EML_B1, a second blue light emitting layer EML_B2 and an anode AN.

Unlike the embodiment shown in FIG. 2, as shown in FIG. 5, the organic light-emitting device in the present embodiment may further include a plurality of charge generation layers CGL for improving the recombination efficiency of current carriers.

Specifically, the charge generation layers CGL may be arranged between the yellow light emitting layer EML_Y and the first blue light emitting layer EML_B1, and between the first blue light emitting layer EML_B1 and the second blue light emitting layer EML_B2.

In the present embodiment, because of the first blue light emitting layer, the organic light-emitting device has a higher light-emitting efficiency and a longer service life. In addition, by setting the charge generation layer, the organic light-emitting device further has a higher luminous brightness and current efficiency.

Although two charge generation layers CGL are shown in FIG. 5, the present embodiment is not limited to this. It should be understood that the organic light-emitting device may include any appropriate number of charge generation layers CGL.

In order to avoid the voltage from being correspondingly increased (to increase the power loss) while the current density of the organic light-emitting device is increased, the charge generation layer CGL may contain a material for promoting hole injection on one side adjacent to the cathode CA, and may also contain a material for promoting electron injection on one side adjacent to the anode AN.

Optionally, the charge generation layer CGL is doped with a p-type material on one side adjacent to the cathode CA and/or doped with an n-type material on one side adjacent to the anode AN, and the thickness of the charge generation layer is 10-50 nm.

More current carriers may be generated under a certain voltage by performing p doping and/or n doping on the charge generation layer CGL, thereby generating a greater current without increasing the voltage accordingly.

Optionally, the p-type material includes at least one of:

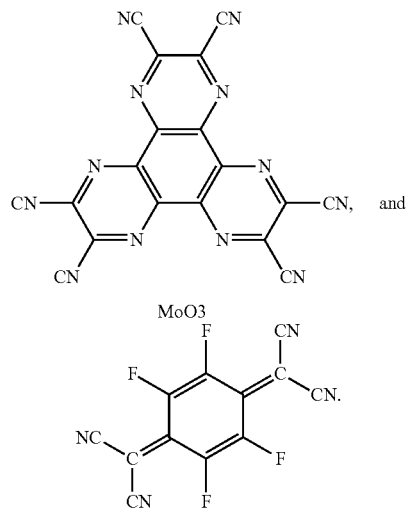

Optionally, the n-type material includes at least one of Yb, Mg, Al, Ca and compounds thereof.

Table 3 shows voltage and current efficiency data of the organic light-emitting device of the comparative embodiment and the organic light-emitting device subjected to p doping and n doping of the present embodiment.

TABLE 3

Voltage and current efficiency of the organic light-emitting device

|  | Comparative embodiment | Present embodiment |
|---|---|---|
| Voltage (v) | 4.48 | 5.10 |
| Current efficiency (cd/A) | 11.22 | 21.66 |

It can be seen from Table 3 that although the voltage of the organic light-emitting device of the present embodiment is slightly higher than the voltage of the organic light-emitting device of the comparative embodiment (the voltage is improved by 0.62V, about 13.8%), the current efficiency is far higher than that of the comparative embodiment (the current efficiency is improved by 9.44 cd/A, about 93%). That is to say, the organic light-emitting device of the present embodiment may have a higher current efficiency.

Figure 6:
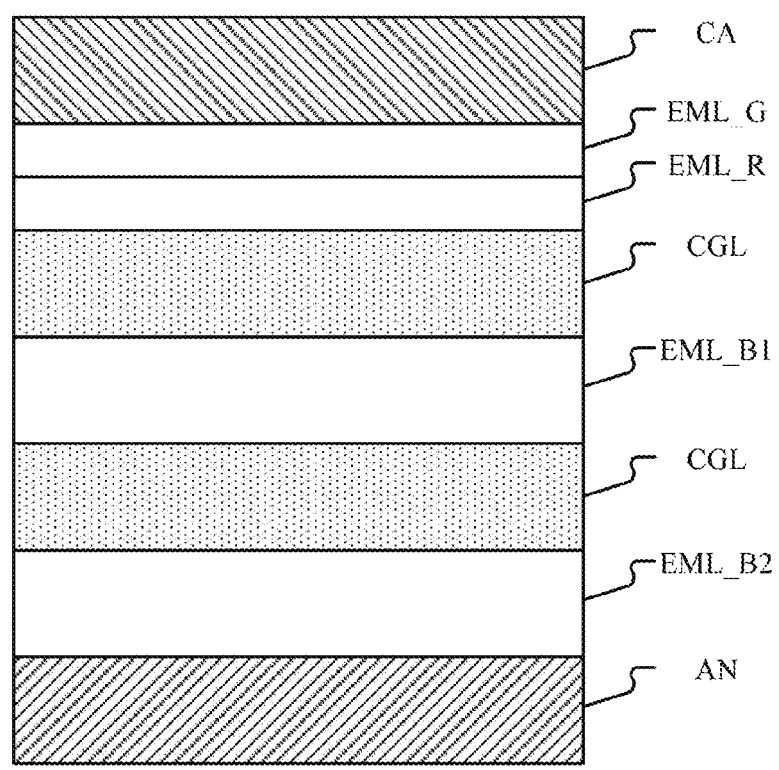
FIG. 6 shows a schematic diagram of the organic light-emitting device of another embodiment of the present application.

Continue to refer to FIG. 6, it shows a schematic diagram of the organic light-emitting device of another embodiment of the present application.

Similar to the embodiment shown in FIG. 5, the organic light-emitting device in the present embodiment may also include a cathode CA, a yellow light emitting layer EML_Y, a first blue light emitting layer EML_B1, a second blue light emitting layer EML_B2, an anode AN and a plurality of charge generation layers CGL.

Unlike the embodiment shown in FIG. 5, as shown in FIG. 6, the yellow light emitting layer in the present embodiment includes a red phosphorescent material EML_R and a green phosphorescent material EML_G laminated together.

According to a three-primary-color principle, after lamination of red and green, yellow (a complementary color for blue) can be formed, and because the red and green phosphorescent materials are relatively mature, the yellow light emitting layer may be formed by laminating the red phosphorescent material EML_R and the green phosphorescent material EML_G together.

In the present embodiment, because of the first blue light emitting layer, the organic light-emitting device has a higher light-emitting efficiency and a longer service life.

Although FIG. 6 shows that the red phosphorescent material EML_R is above the green phosphorescent material EML_G, it is only schematic. It should be understood that the red phosphorescent material EML_R and the green phosphorescent material EML_G may be interchanged in order, for example, the green phosphorescent material EML_G is above the red phosphorescent material EML_R, which may be set by those skilled in the art according to needs of actual application scenarios.

Although not shown, it should be understood by those skilled in the art that when the yellow light emitting layer includes the red phosphorescent material EML_R and the green phosphorescent material EML_R laminated together, a charge generation layer may be arranged between the red phosphorescent material EML_R and the green phosphorescent material EML_G to improve the recombination efficiency of the current carriers.

Optionally, the red phosphorescent material EML_R has a lowest unoccupied molecular orbital energy level of 2.9-3 eV and a highest occupied molecular orbital energy level of 5-5.8 eV.

Optionally, the green phosphorescent material EML_G has a lowest unoccupied molecular orbital energy level of 2.5-3 eV and a highest occupied molecular orbital energy level of 5-6 eV.

The red fluorescent material EML_R and the green phosphorescent material EML_G meeting the LUMO and the HOMO of the above ranges may enable the yellow light emitting layer to have a higher light-emitting efficiency.

Although FIG. 6 shows that the yellow light emitting layer is formed by laminating the red phosphorescent material EML_R and the green phosphorescent material EML_G together, the present application is not limited to this. It should be appreciated that the yellow light emitting layer also may be formed by a phosphorescent material with a single wavelength, for example, an orange phosphorescent material.

Figure 7:
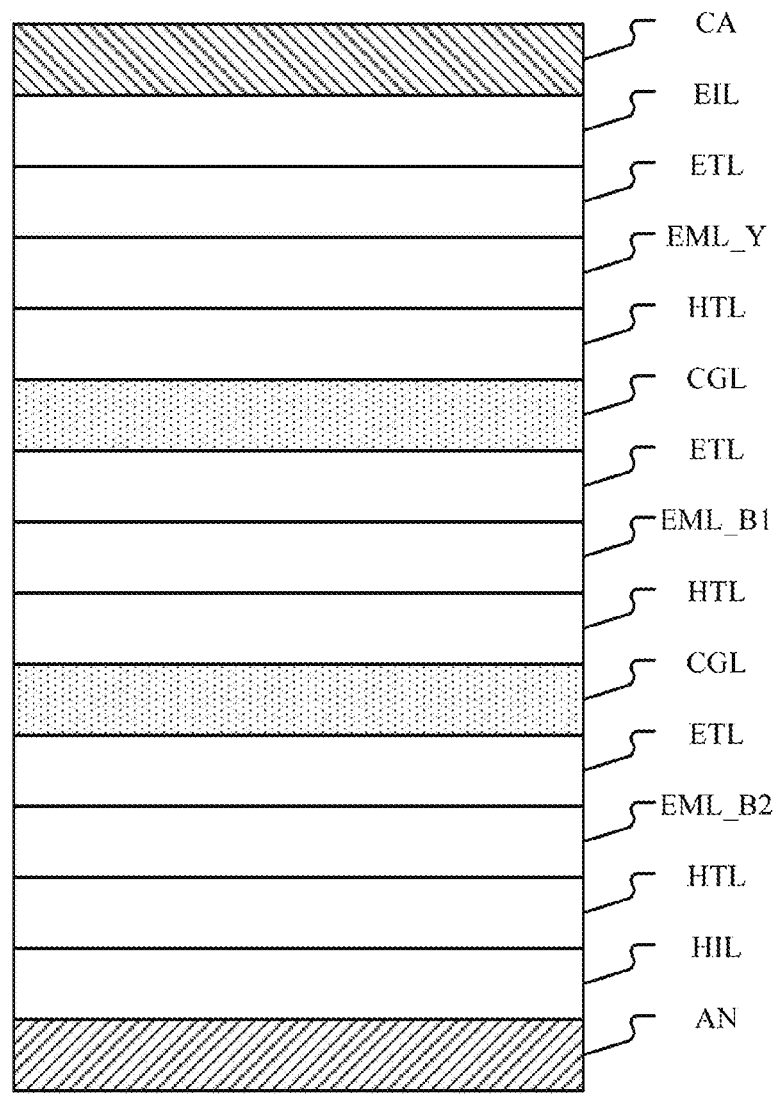
FIG. 7 shows a schematic diagram of the organic light-emitting device of another embodiment of the present application.

Continue to refer to FIG. 7, it shows a schematic diagram of the organic light-emitting device of another embodiment of the present application.

Similar to the embodiment shown in FIG. 5, the organic light-emitting device in the present embodiment may also include a cathode CA, a yellow light emitting layer EML_Y, a first blue light emitting layer EML_B1, a second blue light emitting layer EML_B2, an anode AN and a plurality of charge generation layers CGL.

Unlike the embodiment shown in FIG. 5, as shown in FIG. 7, the organic light-emitting device in the present embodiment may further include a plurality of electron transport layers ETL and a plurality of hole transport layers HTL.

Specifically, the electron transport layers ETL are arranged between the cathode CA and the yellow light emitting layer EML_Y, between the yellow light emitting layer EML_Y and the first blue light emitting layer EML_B1, and between the first blue light emitting layer EML_B1 and the second blue light emitting layer EML_B2 to transport injected electrons to the light emitting layers (for example, the yellow light emitting layer EML_Y, the first blue light emitting layer EML_B1 and the second blue light emitting layer EML_B2). The hole transport layers HTL are arranged between the second blue light emitting layer EML_B2 and the anode AN, between the second blue light emitting layer EML_B2 and the first blue light emitting layer EML_B1, and between the first blue light emitting layer EML_B1 and the yellow light emitting layer EML_Y to transport injected holes to the light emitting layers.

In the present embodiment, because of the yellow light emitting layer, the first blue light emitting layer and the second blue light emitting layer, the organic light-emitting device has a higher light-emitting efficiency and a longer service life. In addition, by setting the plurality of electron transport layers and the plurality of hole transport layers, the electron and hole transport characteristics of the organic light-emitting device are enhanced, and then the recombination efficiency of the current carriers is improved.

The electron transport layers ETL may utilize a material of which electron transport characteristics are higher than hole transport characteristics, for example, a material of which the electron mobility is greater than $1 \times 10^{-6}$ cm$^2$/Vs, for example, at least one of a spirofluorene derivative, a carbazole derivative and a combination thereof with at least one of triazinyl and oxadiazol.

The hole transport layers HTL may utilize a material of which hole transport characteristics are higher than electron transport characteristics, for example, a material of which the hole mobility is greater than $1 \times 10^{-6}$ cm$^2$/Vs, for example, a triphenylamine derivative.

In addition, the organic light-emitting device may further include an electron injection layer EIL and a hole injection layer HIL. The electron injection layer EIL may be arranged between the cathode CA and the electron transport layer ETL to reduce electron injection barriers from the cathode CA to the electron transport layer ETL; and the hole injection layer HIL may be arranged between the anode AN and the hole transport layer HTL to reduce hole injection barriers from the anode AN to the hole transport layer HTL.

The electron injection layer EIL may be doped with a p-type material, and the p-type material doped in the electron injection layer EIL may be identical with the p-type material doped in the charge generation layer CGL. The hole injection layer HIL may be doped with an n-type material, and the n-type material doped in the hole injection layer HIL may be identical with the n-type material doped in the charge generation layer CGL.

According to a light exit direction, the organic light-emitting device in each embodiment of the present application may be of a top emission type or a bottom emission type. In a bottom emission structure, light exits from the bottom (for example, the anode AN side) of the organic light-emitting device, but in a top emission structure, the light exits from the top (for example, the cathode CA side) of the organic light-emitting device.

Because most organic materials for electroluminescence have a lowest unoccupied molecular orbital energy level of 2.5-3.5 eV and a highest occupied molecular orbital energy level of 5-6 eV, in order to reduce the injection barriers of electrons and holes, the cathode CA needs to utilize a metal material with a low work function, while the anode AN needs to utilize a material with a high work function.

The material used as the anode AN may include a transparent conducting oxide and a metal, and usually the transparent conducting oxide is utilized, for example, ITO (Indium Tin Oxide) with a thickness of 10-100 nm. In the top emission structure, because the anode AN serves as a reflecting electrode, it may include a light-tight metal material, for example, Ag. In other words, the anode AN may be a two-layer structure (for example, ITO/Ag) or a multilayer structure (for example, ITO/Ag/ITO) composed of the transparent conducting material and a first metal conducting material.

The material used as the cathode CA may include an alkali metal, an alkaline earth metal or a lanthanide series metal, for example, Ni, Au, Ag, Pt or Cu. In addition, in order to overcome a problem of high chemical activity of some metals (easily oxidized or stripped), a metal alloy (e.g., Mg:Ag or Li:Al) with stable chemical properties may be utilized to form the cathode CA.

Optionally, the cathode CA may be an magnesium-silver alloy with a mass ratio of 1:9, and the thickness of the cathode CA may be 10-50 nm. The addition of silver improves the chemical stability of the cathode CA and enhances the adhesion between the cathode CA and an organic layer (e.g., an electron injection layer EIL).

Figure 8:
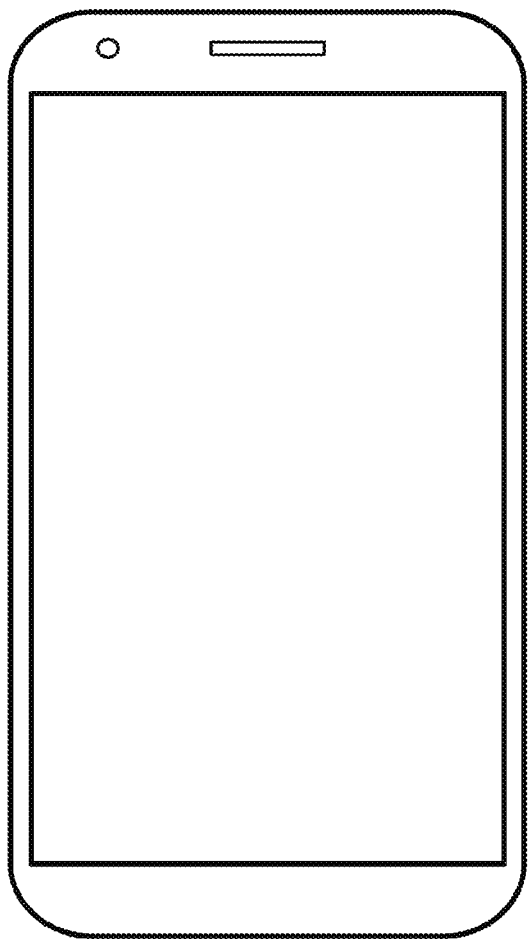
FIG. 8 shows a schematic structure diagram of an embodiment of the display panel of the present application.

The present application further discloses a display device, as shown in FIG. 8. Further, the display device 800 may include the organic light-emitting device described above. It should be understood by those skilled in the art that the display device may further include some other known structures, for example, a substrate, a thin-film transistor and the like, in addition to the organic light-emitting device described above. In order not to obscure the focus of the present application, these known structures may no longer be further described.

The display device of the present application may be any device containing the organic light-emitting device described above, including but not limited to, as shown in FIG. 8, a cellular mobile phone 800, a tablet computer, a computer display, a display applied to a smart wearable device, a display device applied to means of transportation, such as an automobile, and the like. As long as a display device contains the structure of the organic light-emitting device disclosed by the present application, it is deemed to fall within the scope of protection of the present application.

According to the organic light-emitting device and display device provided by the present application, the light-emitting efficiency of the organic light-emitting device is improved while the reliability of the organic light-emitting device is ensured.

The above description only provides an explanation of embodiments of the present application and the technical principles used. It should be appreciated by those skilled in the art that the inventive scope of the present application is not limited to the technical solutions formed by the particular combinations of the above-described technical features. The inventive scope should also cover other technical solutions formed by any combinations of the above-described technical features or equivalent features thereof without departing from the concept of the application. Technical schemes formed by the above-described features being interchanged with, but not limited to, technical features with similar functions disclosed in the present application are examples.

What is claimed is:

1. An organic light-emitting device, comprising an anode, a cathode, and a first blue light emitting layer, a second blue light emitting layer and a yellow light emitting layer laminated between the anode and the cathode, wherein the yellow light emitting layer is arranged between the cathode and the first blue light emitting layer, and the first blue light emitting layer is arranged between the yellow light emitting layer and the second blue light emitting layer; and the yellow light emitting layer comprises a phosphorescent material, one of the first blue light emitting layer and the second blue light emitting layer comprises a blue fluorescent material, and another of the first blue light emitting layer and the second blue light emitting layer comprises a blue thermally-activated delayed fluorescent material used as an auxiliary material between a host and a guest, wherein the yellow light emitting layer comprises a red phosphorescent material and a green phosphorescent material laminated together.

2. The organic light-emitting device according to claim 1, further comprising a plurality of charge generation layers arranged between the yellow light emitting layer and the first blue light emitting layer and between the first blue light emitting layer and the second blue light emitting layer.

3. The organic light-emitting device according to claim 2, wherein the charge generation layers are doped with a p-type material on a side adjacent to the cathode and/or doped with an n-type material on a side adjacent to the anode, and a thickness of the charge generation layers is 10-50 nm.

4. The organic light-emitting device according to claim 3, wherein the p-type material comprises at least one of:

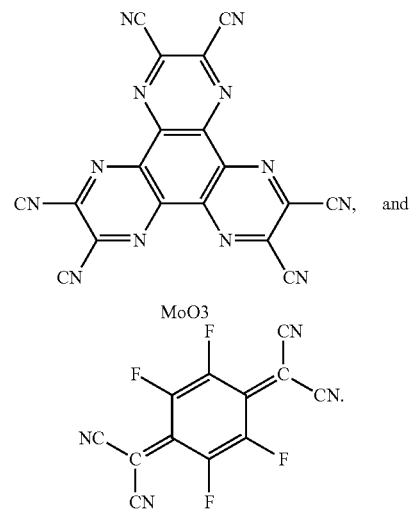

5. The organic light-emitting device according to claim 3, wherein the n-type material comprises at least one of Yb, Mg, Al, Ca and compounds thereof.

6. The organic light-emitting device according to claim 1, wherein the blue thermally-activated delayed fluorescent material comprises at least one of:
acridine, triazine, quinazoline, carbazole and derivatives, dibenzofuran, dibenzothiophene, benzene, biphenyl, naphthalene, and anthracene.

7. The organic light-emitting device according to claim 1, wherein a difference between a singlet energy level and a triplet energy level of the blue thermally-activated delayed fluorescent material is less than 0.15 eV.

8. The organic light-emitting device according to claim 7, wherein a photoluminescence spectrum of the blue thermally-activated delayed fluorescent material has a range of 450-470 nm.

9. The organic light-emitting device according to claim 8, wherein the blue thermally-activated delayed fluorescent material comprises a group having a structure of:

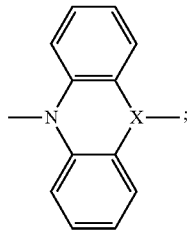

where X is C, O, S, N or Si.

10. The organic light-emitting device according to claim 9, wherein the blue thermally-activated delayed fluorescent material comprises:

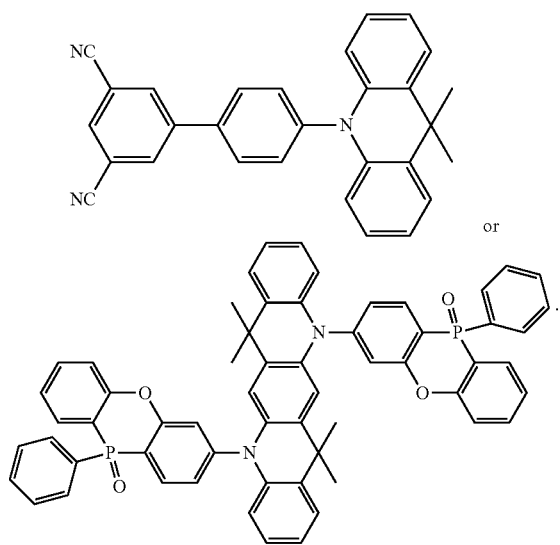

11. The organic light-emitting device according to claim 1, wherein the red phosphorescent material has a lowest unoccupied molecular orbital energy level of 2.9-3 eV and a highest occupied molecular orbital energy level of 5-5.8 eV.

12. The organic light-emitting device according to claim 1, wherein the green phosphorescent material has a lowest unoccupied molecular orbital energy level of 2.5-3 eV and a highest occupied molecular orbital energy level of 5-6 eV.

13. The organic light-emitting device according to claim 1, wherein the blue fluorescent material has a lowest unoccupied molecular orbital energy level of 2.8-3 eV and a highest occupied molecular orbital energy level of 5.5-6 eV.

14. The organic light-emitting device according to claim 1, further comprising a plurality of electron transport layers and a plurality of hole transport layers, wherein
the electron transport layers are arranged between the cathode and the yellow light emitting layer, between the yellow light emitting layer and the first blue light emitting layer and between the first blue light emitting layer and the second blue light emitting layer, and the hole transport layers are arranged between the second blue light emitting layer and the anode, between the second blue light emitting layer and the first blue light emitting layer and between the first blue light emitting layer and the yellow light emitting layer.

15. The organic light-emitting device according to claim 14, wherein the hole transport layers comprise a triphenylamine derivative, and the electron transport layers comprise at least one of:
a spirofluorene derivative, a carbazole derivative and a combination thereof having at least one of triazinyl and oxadiazol.

16. The organic light-emitting device according to claim 1, wherein a mass percent of the blue thermally-activated delayed fluorescent material in the first blue light emitting layer or the second blue light emitting layer is 15-35%.

17. The organic light-emitting device according to claim 1, wherein the organic light-emitting device is of a top emission type or a bottom emission type.

18. The organic light-emitting device according to claim 1, wherein the anode comprises a transparent conducting material with a thickness of 10-100 nm; and the cathode comprises a metal conducting material with a thickness of 10-50 nm.

19. The organic light-emitting device according to claim 18, wherein the anode further comprises a light-tight metal conducting material.

20. A display device, comprising:
an organic light-emitting device, including:
an anode, a cathode, and a first blue light emitting layer, a second blue light emitting layer and a yellow light emitting layer laminated between the anode and the cathode, wherein the yellow light emitting layer is arranged between the cathode and the first blue light emitting layer, and the first blue light emitting layer is arranged between the yellow light emitting layer and the second blue light emitting layer; and
the yellow light emitting layer comprises a phosphorescent material, one of the first blue light emitting layer and the second blue light emitting layer comprises a blue fluorescent material, and another of the first blue light emitting layer and the second blue light emitting layer comprises a blue thermally-activated delayed fluorescent material used as an auxiliary material between a host and a guest,
wherein the yellow light emitting layer comprises a red phosphorescent material and a green phosphorescent material laminated together.

* * * * *